United States Patent [19]
Takayama et al.

[11] Patent Number: 6,017,438
[45] Date of Patent: Jan. 25, 2000

[54] METHOD FOR PRODUCING CIRCUIT SUBSTRATE HAVING BUMP CONTACT POINT AND JET STREAM TYPE PLATING APPARATUS USED THEREFOR

[75] Inventors: Yoshinari Takayama; Toshiki Naito; Kazuo Ouchi, all of Ibaraski, Japan

[73] Assignee: Nitto Denko Corporation, Osaka, Japan

[21] Appl. No.: 08/938,555

[22] Filed: Sep. 26, 1997

[30] Foreign Application Priority Data

Sep. 26, 1996 [JP] Japan .................................. 8-255172

[51] Int. Cl.[7] ...................................................... C25D 5/08
[52] U.S. Cl. ............................ 205/133; 205/98; 205/125; 205/126
[58] Field of Search ..................................... 205/133–157, 205/98–101, 148, 125–126; 204/224 R

[56] References Cited

U.S. PATENT DOCUMENTS 5,391,285 2/1995 Lytle et al. ............................... 205/123
5,421,985 6/1995 Clouser et al. ........................... 205/77

OTHER PUBLICATIONS

Patent Abstract of Japan, Horasawa Takayasu, "Method of Plating Bump of Semiconductor Device", Nov. 6, 1992, 04315434 A.
Patent Abstract of Japan, Hirose Yoshima, "Plating Device of Plated Material Having Fine Plated Region", Jan. 13, 1995, 07011498 A.
Patent Abstract of Japan, Garetsuto EE Garetsutoson et al., "Testing Probe", Aug. 11, 1987.
Patent Abstract of Japan, Sakaida Atsusuke, "Plating Device", Mar. 1, 1990.
Lowenheim, Frederick A., Electroplating, McGraw–Hill, pp. 138–141, Jan. 8, 1979.

Primary Examiner—Kathryn Gorgos
Assistant Examiner—Wesley A. Nicolas
Attorney, Agent, or Firm—Sughrue, Mion, Zinn, Macpeak & Seas, PLLC

[57] ABSTRACT

A method for producing a circuit substrate having a bump contact point, comprising the steps of (a) disposing a positive electrode in a plating solution stored in a storage tank, (b) exposing a conductive circuit formed on an insulating substrate, above the surface of the plating solution, (c) disposing a jet stream opening below the surface of the plating solution, and (d) spouting out the plating solution from the jet stream opening toward the negative electrode for electroplating using said conductive circuit as a negative electrode, to form the bump contact point on the surface of the negative electrode, and a jet stream type plating apparatus used therefor. According to the present invention, mixing of air bubbles in the plating solution can be inhibited, which in turn enables suppression of oxidative decomposition of the brightener components. As a consequence, the bump contact point can have a mushroom shape, and variation in the height of the bump contact points can be minimized. In addition, slip of the vertex of the bump contact point and loss of bump contact points can be avoided.

6 Claims, 8 Drawing Sheets

METHOD FOR PRODUCING CIRCUIT SUBSTRATE HAVING BUMP CONTACT POINT AND JET STREAM TYPE PLATING APPARATUS USED THEREFOR

TECHNICAL FIELD OF THE INVENTION

The present invention relates to a method for producing a circuit substrate having a bump contact point and a jet stream type plating apparatus used therefor.

BACKGROUND OF THE INVENTION

So as to meet the demand in recent years for small, lightweight, high speed, highly functional electronics, IC chip-sized elements are connected when mounting a semiconductor, as in Chip Size Package (CSP) and the like.

In addition, tests of electrical properties, such as a burn-in test, are required to be done at die stages. For this end, a flexible film carrier has been developed to connect fine-pitched IC chips and to provide contact points for testing. The film carrier has connection points, i.e., bump contact points, at which point a test subject and a mounted element come into contact with each other on an insulating substrate (Japanese Patent Unexamined Publication No. 62-182672).

For forming bump contact points, an electroplating by an immersion method and a jet stream method has been conventionally applied. From the technical aspect, however, developments have been mostly made with respect to semiconductor wafers with the aim of eliminating abnormal precipitation of bump contact points and for forming bump contact points having a uniform height. For example, in Japanese Patent Unexamined Publication No. 2-61089, a liquid jet nozzle and the surface to be plated are kept parallel to each other for secondary fluctuation of the nozzle, so as to prevent deformed bump contact points produced due to the flow direction of the plating solution on the surface to be plated. According to the method utilizing a jet stream cup (Japanese Patent Unexamined Publication No. 4-315434), wafers are maintained by a control member and plated while floating horizontally on an overflowing plating solution, whereby bump contact points having a uniform height are obtained.

However, unification of the height of bump contact points is mostly studied with respect to plating using a plating solution without a brightener, namely, plating with precious metals (e.g., gold and silver) or solder (e.g., tin and zinc), without a brightener, and there appear to be very few studies of bump contact points which involve the use of a gloss plating solution containing a leveler and a brightener, and a jet stream type plating apparatus, so as to examine abnormal bump contact points associated with deformation and absence of formation.

For example, as disclosed in Japanese Patent Unexamined Publication No. 7-11498, the area of an insoluble anode is set to not less than 0.5 times the plating area and not more than 5 times that, so as to prevent or suppress decomposition of the brightener in an insoluble anode. The insoluble anode means anodes which are not dissolved in a plating solution, and which generally comprise a metallic core of titanium, niobium and the like and a coating of platinum on the surface of the core. Some of them have a surface covered by iridium.

The brightener for copper sulfate plating includes, for example, high molecular weight leveler (e.g., polyethylene glycol) and a brightener (e.g., bis(3-sulfopropyl)disulfide). A brightener is significantly decomposed in a jet stream type plating that catches much air, which in turn often causes imbalance of the components of the brightener.

When copper bump contact points are formed using an imbalanced plating solution, the bump contact points tend to be flat as compared to normal mushroom-shaped bump contact points, and are easily affected by the liquid flow, thus resulting in the vertex of the bump contact point being slipped in the flow direction and greater variations in height. Further imbalance results in no gloss but rough surface of the bump contact point. If gold is plated on a copper core formed using a plating solution containing an imbalanced brightener, contact failure in electrical testing and defective connection to IC chip in mounting a semiconductor mounted are observed.

When compared to a plating solution showing good throwing power, such as that to be used for gold plating and the like, a plating solution containing a brightener easily catches air bubbles, which tendency becoming prominent when using a jet stream plating apparatus wherein the object to be plated is faced downward and a liquid is spouted out from underside. These air bubbles prevent growth of bump contact points and cause less height or deformation thereof, even if bump contact points can grow at all, which in turn leads to contact failure in electrical testing and defective connection to IC chip in mounting a semiconductor, as mentioned above.

It is therefore an object of the present invention to solve the above-mentioned problems and provide a production method of a circuit substrate having bump contact points free of abnormal precipitation and nonuniform height, and a jet stream type plating apparatus to be used therein.

SUMMARY OF THE INVENTION

The inventive production method of a circuit substrate having a bump contact point characteristically comprises the following.

(1) A method for producing a circuit substrate having a bump contact point, comprising the steps of
   (a) disposing a positive electrode in a plating solution stored in a storage tank,
   (b) exposing a conductive circuit formed on an insulating substrate, above the surface of the plating solution,
   (c) disposing a jet stream opening below the surface of the plating solution, and
   (d) spouting out the plating solution from the jet stream opening toward the negative electrode for electroplating using said conductive circuit as a negative electrode, to form the bump contact point on the surface of the negative electrode.

(2) The method of (1) above, wherein the negative electrode is a conductive circuit exposed in a through-hole formed at a position of the insulating substrate at which the bump contact point is to be formed.

(3) The method of (1) above, wherein the plating solution is a copper sulfate plating solution, and the distance between the surface of the copper sulfate plating solution stored in the storage tank and the jet stream opening is 5 mm–40 mm.

(4) The method of (3) above, wherein the plating solution is spouted out from one jet stream opening in a flow amount of 30 L/hr–200 L/hr, and the plating solution is set to a temperature of 20° C.–30° C. and applied with a current having a density of 10 A/dm$^2$–20 A/dm$^2$.

(5) The method of (1) above, wherein the storage tank has a box-like block in the center thereof and the positive electrode is formed in the block.

(6) The method of (1) above, wherein the jet stream opening is formed by providing a through-hole in a plate.

The jet stream type plating apparatus of the present invention is characteristically comprises the following.

(7) A jet stream type plating apparatus for forming a bump contact point on a negative electrode, using a conductive circuit formed on an insulating substrate as the negative electrode, comprising a storage tank to store a plating solution, a jet stream opening formed at a position below the surface of the plating solution, and a positive electrode placed in the plating solution, the jet stream opening permitting spouting out of the plating solution toward the negative electrode.

(8) The apparatus of (7) above, wherein the jet stream opening is formed at a position 5 mm–40 mm below the surface of the plating solution.

(9) The apparatus of (7) above, wherein the jet stream opening is formed by providing a through-hole in a plate.

(10) The apparatus of (7) above, wherein the negative electrode is a conductive circuit exposed in a through-hole formed at a position of the insulating substrate at which a bump contact point is to be formed.

(11) The apparatus of (7) above, wherein the storage tank has a box-like block placed in the center portion thereof.

(12) The apparatus of (7) above, further comprising a plate having an aperture permitting exposure of the negative electrode, the plate being set between the negative electrode and the storage tank.

(13) The apparatus of (12) above, wherein the plate comprises a slit connecting with the aperture and a groove, which are formed in the thickness direction of the plate from its surface corresponding to the storage tank, such that they cross and connect each other, one or both of the slit and the groove being capable of delivering the spouted out plating solution to the outside of the storage tank.

(14) The apparatus of (12) above, wherein the plate comprises a slit connecting with the aperture and a groove not connecting with the aperture, which are formed in the thickness direction of the plate from its surface corresponding to the storage tank, such that they cross and connect each other, the groove being capable of delivering the spouted out plating solution to the outside of the storage tank.

(15) The apparatus of (12) above, wherein the plate has a thickness of 5 mm–30 mm.

(16) The apparatus of (7) above, further comprising a jet stream treatment tank and a supply tank, wherein the plating solution is used for jet stream plating in the jet stream treatment tank capable of housing a storage tank, of storing the plating solution after electroplating and of feeding the supply tank with the plating solution, and wherein the supply tank stores the plating solution fed from the jet stream treatment tank and feeds the storage tank with the plating solution.

(17) The apparatus of (16) above, wherein one or both of the jet stream treatment tank and the supply tank contain(s) a nitrogen gas above the surface of the plating solution therein.

(18) The apparatus of (17) above, wherein the nitrogen gas has a purity of not less than 99.9%.

(19) The apparatus of (16) above, wherein the storage tank is fed with the plating solution introduced from 2 to 4 supply inlets formed on the storage tank.

According to the present invention, a circuit substrate having a bump contact point is prepared by providing a jet stream opening below the surface of a plating solution stored in a storage tank, exposing a conductive circuit (which is a negative electrode) above the surface of the plating solution, spouting the plating solution from the jet stream opening toward the negative electrode for electroplating to form a bump contact point on the negative electrode surface. As a result, the plating solution does not catch bubbles. In particular, the present invention is beneficial when using a plating solution containing a brightener that catches bubbles easily, in which case oxidative decomposition of the components of the brightener can be also inhibited. In addition, electroplating can be performed under a nitrogen gas atmosphere, thereby significantly suppressing the oxidative decomposition of the components of the brightener.

BRIEF DESCRIPTION OF THE DRAWINGS

FIGS. 3($a$)-3($b$) are top views of the cubic storage tank to be used for the inventive jet stream type plating apparatus.

FIGS. 4($a$)-4($c$) are top views of the columnar storage tank to be used for the inventive jet stream type plating apparatus.

FIGS. 5($a$)-($b$) show insulating substrates to be processed.

FIGS. 6($a$)-($b$) are cross sectional views showing a jet stream opening and a plate to be used for the inventive jet stream type plating apparatus.

DETAILED DESCRIPTION OF THE INVENTION

The present invention is described in more detail by referring to the drawings.

Figure 1:
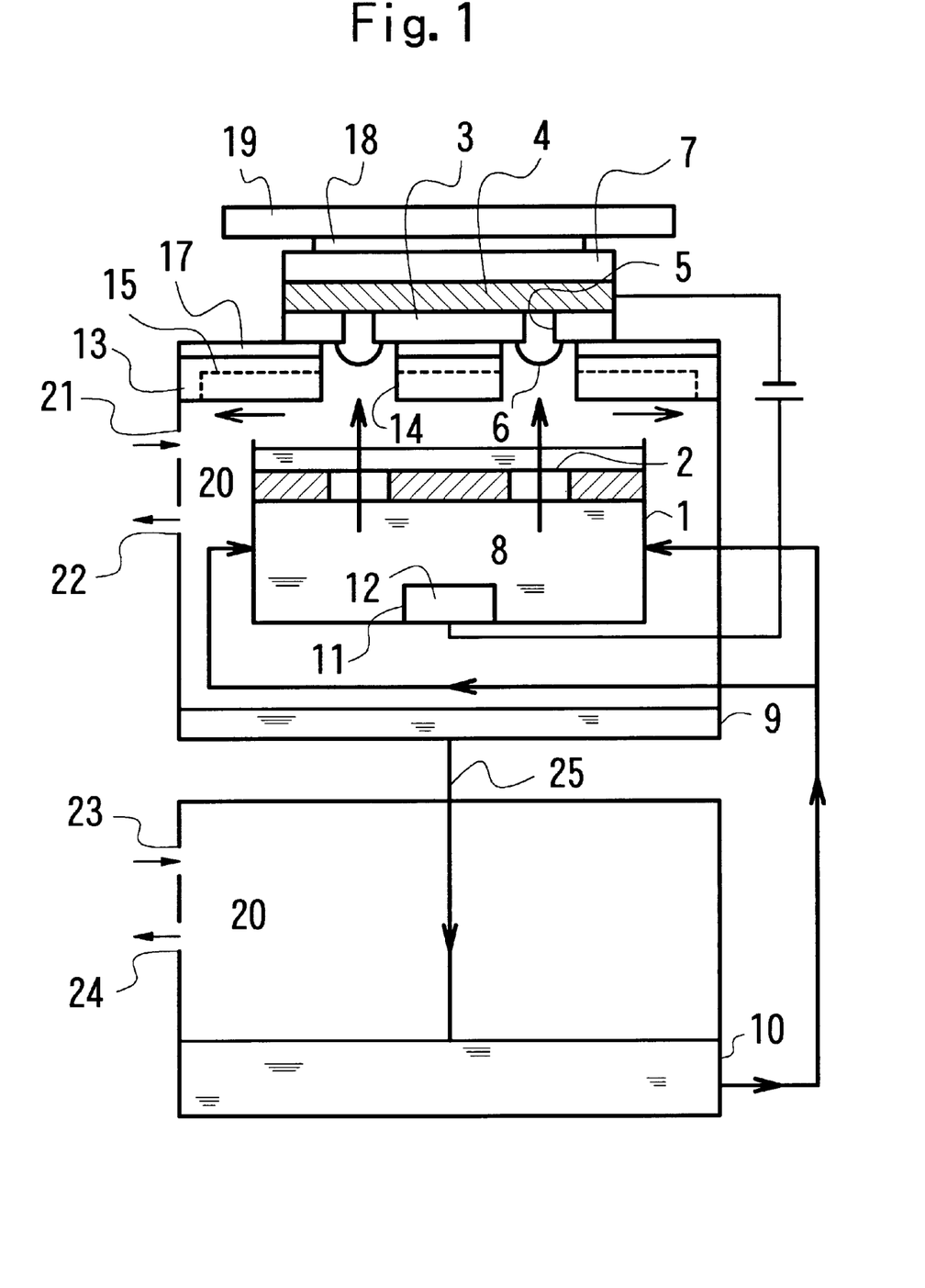
FIG. 1 is a cross sectional view showing one embodiment of the inventive production method of a circuit substrate having a bump contact point, and a jet stream type plating apparatus to be used therefor.

FIG. 1 is a cross sectional view showing one embodiment of the inventive production method of a circuit substrate having a bump contact point and shows one embodiment of the jet stream type plating apparatus used therefor wherein the bump contact point is formed by electroplating. The cross sections of a conductive circuit 4 and a plate on which to form a jet stream opening 2 are hatched.

As shown in this embodiment, the jet stream type plating apparatus uses the conductive circuit 4 formed on an insulating substrate 3 as a negative electrode. The jet stream type plating apparatus comprises a storage tank 1 to store a plating solution 8 and a jet stream opening 2 formed below the surface of the plating solution 8. A positive electrode 12 is set in the plating solution 8.

The conductive circuit 4, which is a negative electrode, is exposed opposite to the jet stream opening 2 and above the surface of the plating solution 8, and the plating solution is spouted from the jet stream opening 2 toward the negative electrode to allow electroplating in this jet stream type plating apparatus, whereby a bump contact point 6 is formed on the negative electrode surface to give a circuit substrate.

In the embodiment shown in this Figure, the conductive circuit 4 is a negative electrode, which is exposed in a through-hole 5 formed at a position of the insulating substrate 3 at which a bump contact point 6 is to be formed. The conductive circuit 4 is further covered with an insulating film 7. The jet stream opening 2 is formed by providing a through-hole in a plate. The positive electrode 12 is set in a box-like block 11 placed below the surface of the plating solution 8. On the top surface of the block 11 is an aperture (not shown) for conducting with the plating solution 8.

The jet stream type plating apparatus further comprises a jet stream treatment tank 9 and a supply tank 10. The storage tank 1 is housed in the jet stream treatment tank 9, and fed with a plating solution from the supply tank 10. Between the negative electrode and storage tank 1 is set a plate 13 having an aperture 14 permitting exposure of the negative electrode. The insulating substrate 3 is arranged on the jet stream treatment tank 9 via the plate 13 and a rubber sheet 17. The rubber sheet 17 also has an aperture corresponding to the aperture 14. The plate 13 has, in addition to the aperture 14, a slit (not shown) and a groove 15.

The plating solution spouted toward the negative electrode is then led by the slit and the groove 15 to the outside of storage tank 1, and stored in the jet stream treatment tank 9. The stored plating solution is delivered to the supply tank 10 by a connecting tube 25. The supply tank 10 again sends out the plating solution to the storage tank 1. A nitrogen gas 20 is supplied to the inside of the jet stream treatment tank 9 and supply tank 10 from inlets 21 and 23, and the nitrogen gas 20 is discharged from discharge ends 22 and 24. The pressure in the jet stream treatment tank 9 and supply tank 10 is maintained at an atmospheric pressure. The supply tank 10 is provided with a heater and a cooler (not shown), whereby the plating solution is maintained at a suitable temperature. On the insulating film 7 are sequentially provided a rubber sheet 18 and press board 19, and the press board 19 is pressed to inhibit liquid leakage from the jet stream treatment tank 9.

The material of the processing target insulating substrate is not particularly limited as long as it stably supports conductive circuit and bump contact point and is substantially electrically insulating. So as to bring the bump contact point into flexible contact with the contact target such as an IC chip, a flexible material is preferably used. Specific examples include thermosetting resins and thermoplastic resins such as polyester resin, epoxy resin, urethane resin, polystyrene resin, polyethylene resin, polyamide resin, polyimide resin, acrylonitrile-butadiene-styrene (ABS) copolymer resin, polycarbonate resin, silicone resin, fluororesin and the like. Of these, polyimide resin is preferably used which is superior in heat resistance, dimensional stability on heating and mechanical strength.

While the thickness of the insulating substrate is not particularly limited, it is 2–500 $\mu$m, preferably 5–150 $\mu$m to achieve sufficient mechanical strength and flexibility. A layer of different kind of resin may be laminated on the surface of the insulating substrate on which the bump contact point is to be formed, according to use thereof. When a semiconductor chip is mounted using a circuit substrate having a bump contact point and such resin layer, the clearance between the circuit substrate having a bump contact point and the semiconductor chip can be advantageously filled up without requiring a separate step therefor after mounting. The resin layer may be made from a known material such as epoxy resin and silicone resin.

A conductive circuit is formed on an insulating substrate. The conductive circuit also functions as a negative electrode in the present invention and is exposed above the surface of the plating solution. The conductive circuit in the present invention includes not only wiring patterns but also electrodes, leads and the like. The material of the conductive circuit is free of any particular limitation as long as it is conductive (e.g., metal). Preferred are known materials used for circuit patterns of circuit substrate. In particular, copper having smaller resistance is preferable, since wiring width may be narrowed to provide fine-pitched contact targets and signals need to be transmitted at higher speeds. While the thickness of the conductive circuit is not particularly limited, it is preferably 1 $\mu$m–200 $\mu$m, more preferably 5 $\mu$m–80 $\mu$m.

A conductive circuit can be formed on an insulating substrate by, for example, electroless plating and sputtering of the insulating substrate, coating of a copper foil to be the conductive circuit with an insulating substrate varnish, followed by curing; adhesion of a conductive circuit film and an insulating substrate with an adhesive; and other method.

The conductive circuit may be further coated with an insulating film. As shown in FIG. 1, a conductive circuit 4 is sandwiched between insulating substrate 3 and insulating film 7. The insulating film may be made from any material as long as it is electrically insulating. When the circuit substrate having an insulating film is used as a final product, the material of the insulating film is preferably the same as that of the insulating substrate, whereby the insulating substrate and insulating film can have the same linear expansion coefficient and do not suffer from the problems possibly caused by temperature variations, such as curling and dimensional shrinkage.

When the insulating film is used as a primary resist film for electroplating, the material of the insulating film may be a known material used for a resist film. Of such materials, one easily released after electroplating and less associated with current leakage during electroplating is preferable. In particular, a heat resistant vinyl chloride resist is preferable in that it is free of current leakage and can be mechanically released by controlling the amount of a plasticizer. The insulating film may be formed by the same method as those recited above for forming a conductive circuit on an insulating substrate. When the insulating film is a vinyl chloride resist, the film can be prepared by screen printing.

A through-hole can be formed in an insulating substrate by mechanical perforation such as punching, photolithography processing, plasma processing, chemical etching, laser processing and the like, with preference given to laser processing which enables elaborate processing to cope with the demand for fine-pitched products; particularly, perforation is desirable using an ultraviolet laser having an oscillation wavelength in the ultraviolet region.

The shape of the through-hole, namely, the shape of the cross section perpendicular to the longitudinal axis of the through-hole is not particularly limited, though circular one is preferable. The diameter of the through-hole is about $\phi$5 $\mu$m–$\phi$200 $\mu$m, particularly about $\phi$8 $\mu$m–$\phi$100 $\mu$m.

When burr and decomposed products remain in the vicinity of a through-hole formed as mentioned above in the insulating substrate, it is preferable to apply a wet desmear treatment using permanganic acid or dry desmear treatment by plasma, before initiation of plating. When burr and decomposed products are present in the vicinity of the through-hole, plating is deposited using them as nuclei, and a mushroom-shaped bump contact point cannot be formed. The desmear treatment means removal of burr and decomposed products, wherein the wet desmear treatment using a permanganic acid includes removal thereof as manganese oxide residue, and the dry desmear treatment using plasma includes removal thereof as carbon dioxide.

When the through-hole is fine or the insulating substrate is hydrophobic, a bump contact point sometimes fails to grow, since the plating solution does not enter the through-hole. Thus, it is preferable to apply a treatment to make the substrate hydrophilic by oxygen plasma treatment, etc. This treatment aims at improving the wettability with water.

The wettability of the insulating substrate as determined before initiation of plating and before a treatment, such as soft etching, to be performed before initiation of plating is preferably not more than 20 degrees of contact angle with pure water. When the wettability is greater than 20 degrees, a plating solution often cannot enter a through-hole having a diameter of about 20 $\mu$m–200 $\mu$m and a depth of about 5 $\mu$m–50 $\mu$m, thus failing to form a bump contact point. The soft etching means a treatment to remove a metal oxide film from the conductive circuit exposed in the through-hole and to ensure adhesion to the plated metal.

The material of the contact point to fill the through-hole and to provide a bump contact point is not particularly limited as long as it precipitates by an electroplating method, and known metallic materials can be used. For example, metals such as gold, silver, copper, platinum, lead, tin, nickel, cobalt, indium, rhodium, chromium, tungsten, ruthenium and the like, various alloys containing these, such as solder, nickel-tin and gold-cobalt, and the like may be used.

Of the exemplified metallic materials, contact point materials precipitated from the plating solution containing a brightener, such as copper precipitated from a copper sulfate plating solution and nickel precipitated from Watts bath and the like are preferably used in the present invention. Particularly, copper is preferable.

The brightener to be contained in the plating solution is not limited, but may be a brightener generally used for electroplating. For example, polyether compound (e.g., polyethylene glycol, polypropylene glycol and polyvinyl alcohol), organic sulfur compound (e.g., bis(3-sulfopropyl) disulfide and bis(p-sulfophenyl)disulfide), organic nitrogen compound (e.g., azo dye and phthalocyanine dye), thiourea, thiocarbazonic acid derivative, and the like may be used.

Each bump contact point may have a structure wherein a bump contact point to be the core made from an economical and good conducting material, such as copper and nickel, and a metal film (surface layer) is applied according to the use thereof, the metal film being made from a metal having a high hardness or a stable material. Examples of such material include various precious metals. For example, when a semiconductor element is to be connected, a material chemically stable and having higher contact reliability, such as gold, is used; and for electrical testing, such as burn-in test, a material having higher hardness, such as rhodium and ruthenium, is preferably used.

While the height of the bump contact point is not particularly limited, it is preferably about 1 $\mu$m–100 $\mu$m. This value is a nominal height of the bump contact point, and the height of the bump contact points to be formed on a single insulating substrate is ideally without any variation. In practice, any variation in height may be within about ±2 $\mu$m, though the degree of variation may be optionally set within the range of tolerance, according to the use thereof. The height of the bump contact point refers to the height of the vertex of the bump contact point from the surface of the insulating substrate.

The conditions of the plating for forming a bump contact point, namely, flow amount of plating solution, temperature of plating solution, current density and the like, may be appropriately determined according to the object to be plated and the kind of the plating solution used. It is preferable that the conditions be set to enable formation of a bump contact point capable of fine connection and contact. In the present invention, the jet stream type electroplating enables acceleration of plating solution flow relative to the object to be plated, and therefore, current density can be made greater. As a result, a bump contact point can be formed at high rates.

For example, when a plating solution is a copper sulfate plating solution containing a brightener, the flow amount of the plating solution spouted from one jet stream opening is preferably set to 30 L/hr–200 L/hr. When the flow amount of the plating solution is less than 30 L/hr, greater numbers of the bump contact points may not be formed and when the flow amount exceeds 200 L/hr, the brightener is decomposed undesirably too fast.

In a similar case, the temperature of the plating solution is preferably set to 20° C.–30° C. When it is less than 20° C., the solution is associated with difficulty in high speed precipitation and easy deformation of the bump, whereas when it is higher than 30° C., the brightener is quickly decomposed, which is disfavored.

In the case of a copper sulfate plating solution having a flow amount of 100 L/hr and temperature of 25° C., the current density is preferably set to 10 A/dm$^2$–20 A/dm$^2$. When the current density is smaller than 10 A/dm$^2$, the shape of the bump contact point becomes undesirably flat. When it exceeds 20 A/dm$^2$, the plating solution easily catches bubbles, so that some of the bump contact points may not be formed or the air bubbles are released in the course of the growth of the bump contact point, so that the height of the bump contact point becomes insufficient or the trace of the air bubbles is left on the bump contact point. It is also unbeneficial in that the cross sectional shape of the bump contact point becomes ellipse when the through-hole is not ellipse but circular.

In the present invention, some of the bump contact points may not be formed, because fine through-holes easily catch air bubbles when electroplated in a liquid, which air bubbles prevent penetration of the plating solution into the through-holes to ultimately prevent growth of the bump.

When the plating solution is Watts bath, the flow amount of the plating solution is preferably set to 30 L/hr–200 L/hr per one jet stream opening, the temperature of the plating solution is preferably set to 30° C.–80° C., and the current density is preferably set to 3 A/dm$^2$–20 A/dm$^2$.

The respective parts of the jet stream type plating apparatus are described in detail in the following, where the size and shape of each part refer to those in the case where a copper sulfate plating solution containing a brightener is used as a plating solution, the flow amount of the plating solution per one jet stream opening is 30 L/hr–200 L/hr, the temperature of the plating solution is 20° C.–30° C., and the current density is 10 A/dm$^2$–20 A/dm$^2$.

The storage tank may be any as long as it can store a plating solution and has an aperture on the upper surface thereof so as not to prevent the jet stream of the plating solution. The shape, volume and the like thereof may be set according to the object of use. The shape of the storage tank is exemplified by a hollow cube, rectangular solid, column and the like having a bottom.

Figure 3A:
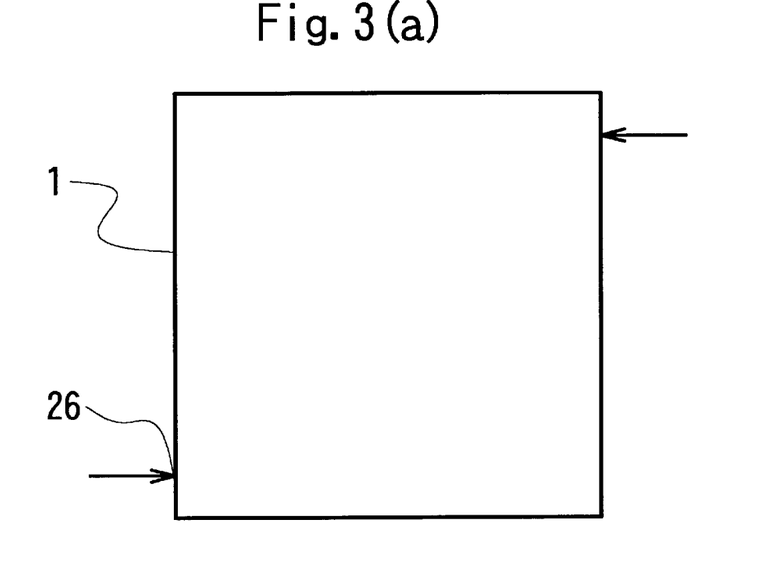
Figure 3B:
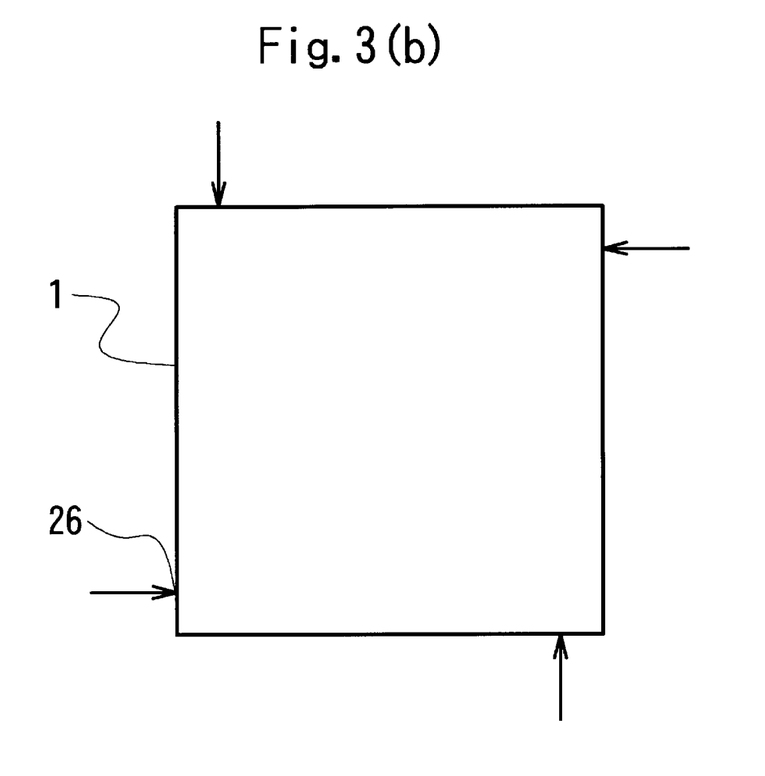
Figure 4A:
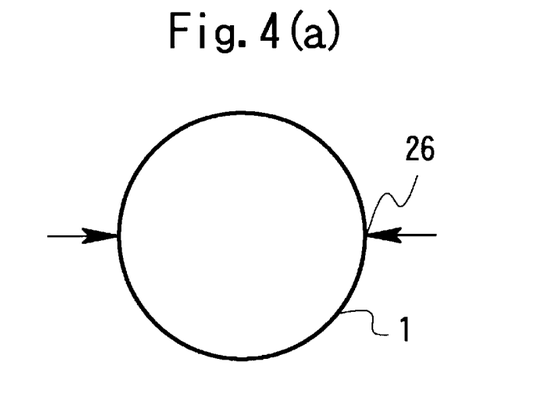
Figure 4B:
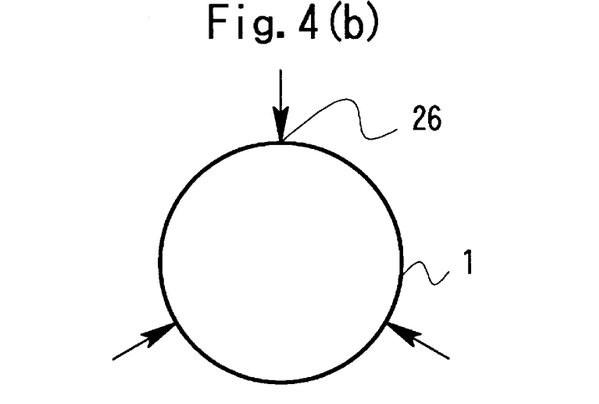
Figure 4C:
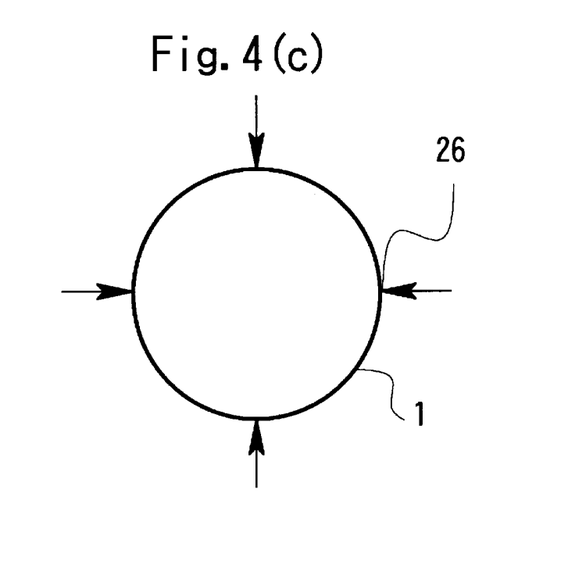

FIGS. 3(a), 3(b) show top views of the storage tank wherein FIG. 3(a) shows a tank having two supply inlets 26 and FIG. 3(b) shows a tank having four supply inlets 26. FIGS. 4(a), 4(b), 4(c) show top views of a hollow columnar storage tank having a bottom, wherein FIGS. 4(a), 4(b), 4(c) respectively show tanks having 2 to 4 supply inlets 26. In each Figure, an arrow shows the direction of the flow of the plating solution to be fed.

As shown in FIG. 3, a plating solution is preferably fed from 2 or 4 supply inlets 26 set at the same intervals on the storage tank which is a hollow cube having a bottom. As shown in FIG. 4, the solution is preferably fed from 2 to 4 supply inlets 26, when the storage tank is columnar. When the number of the supply inlets 26 is other than these, the liquid pressure of the plating solution to be spouted varies, which unfavorably causes different heights of bump contact points. The positions of the supply inlets 26 are, as shown in FIGS. 3, 4, preferably point symmetric relative to the center of the storage tank, when the storage tank is cube or columnar and looks square when viewed from the front.

Figure 5A:
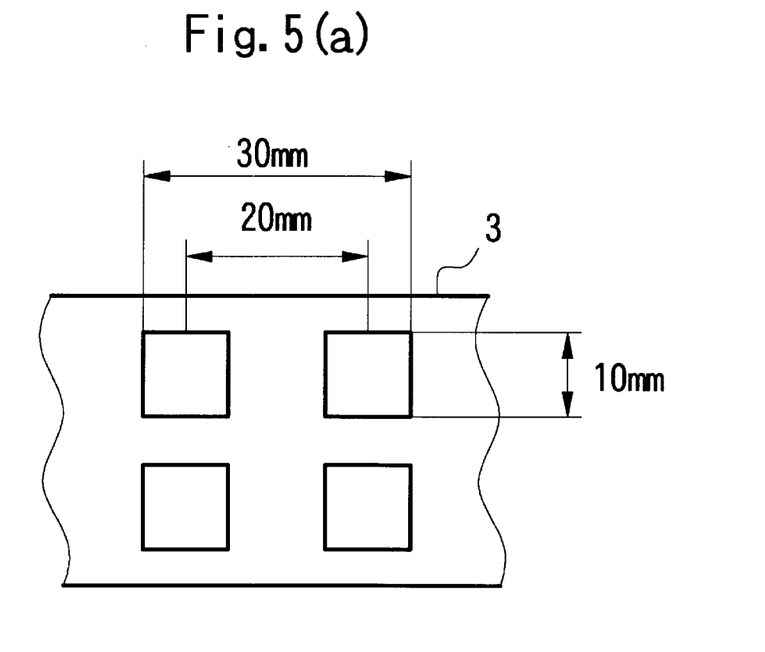
Figure 5B:
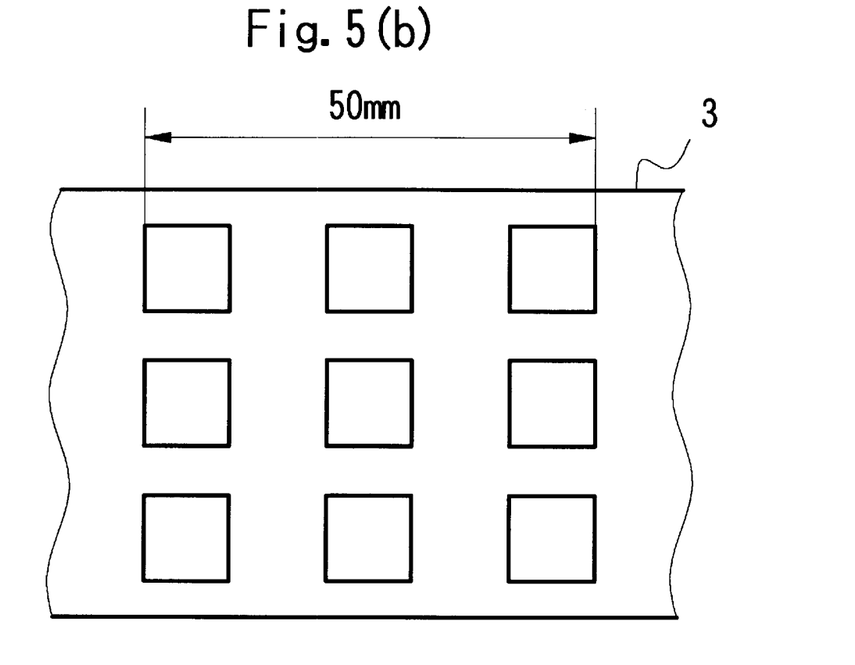

FIGS. 5(a), 5(b) show plane views of insulating substrates which are the processing targets. In this Figure, plural through-holes (not shown) are disposed on a 10 mm one side square such that the center of the through-hole comes on any of the sides of the square (only the square is shown). A plurality of through-holes which are disposed on the four sides of one square is taken as one set. In FIG. 5(a), 4 sets of through-holes are formed and they are treated in one cycle of plating. When the pitch of the set is 20 mm, the shortest distance between farthermost two sides of two squares in adjacency is 30 mm. In FIG. 5(b), 9 sets of through-holes are formed which are to be treated in one cycle of plating. In this case, the plated area (area to be treated by one cycle of plating) becomes wider and is 50 mm from one end of said area to the other opposing end covering the 9 sets.

When the area to be treated by one cycle of plating is widened, the liquid pressure varies between the center portion of the storage tank and outer periphery portion thereof, thereby making the liquid pressure of the center portion higher. In this case, a block 11 is formed in the center portion of the storage tank, as shown in FIG. 1, to overcome this problem. Moreover, current distribution can be controlled by making the block 11 a hollow box comprising a positive electrode therein, forming an aperture (not shown) on the top surface of the block for conduction with the plating solution, and varying the size and position of the aperture.

Figure 6A:
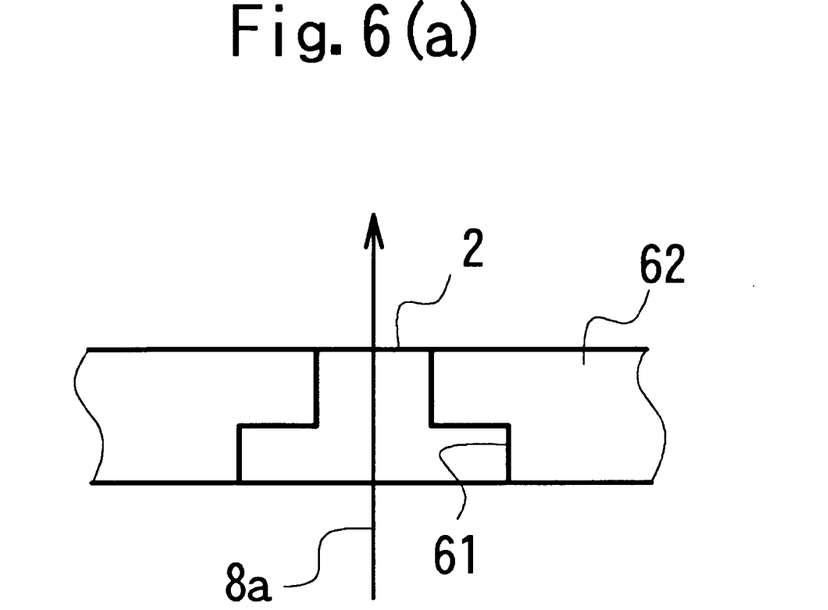
Figure 6B:
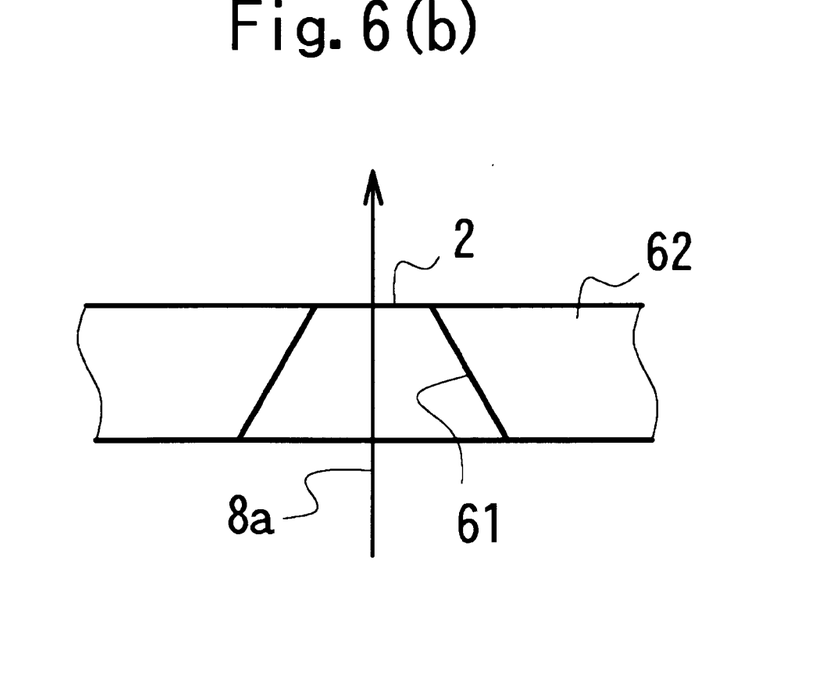

A jet stream opening from which the plating solution is spouted out upwardly, is installed under the surface of the plating solution stored in the storage tank, and may be any as long as it allows spouting out of the plating solution toward the negative electrode. Specifically, the opening on the negative electrode side of the through-hole formed in a plate as shown in FIG. 1 is used as a jet stream opening 2. FIGS. 6(a), 6(b) show cross sectional views showing the jet stream opening 2 and the plate 62. The sectional shape of the through-hole 61 formed in the plate 62 may be convex as shown in FIG. 6(a), or tapered as shown in FIG. 6(b), wherein 8a indicates the direction of the plating solution flow.

When plural negative electrodes are involved, the plating solution may be spouted separately towards each negative electrode, or spouted from a single jet stream opening towards plural negative electrodes. The shape of the jet stream opening is not particularly limited and may be circular, rectangular or other polygon, with preference given to a circular one since it permits easy processing.

The size of the jet stream opening is determined according to various conditions, such as flow amount of the plating solution, the size of the processing target through-holes formed in the insulating substrate and the like.

Figure 7:
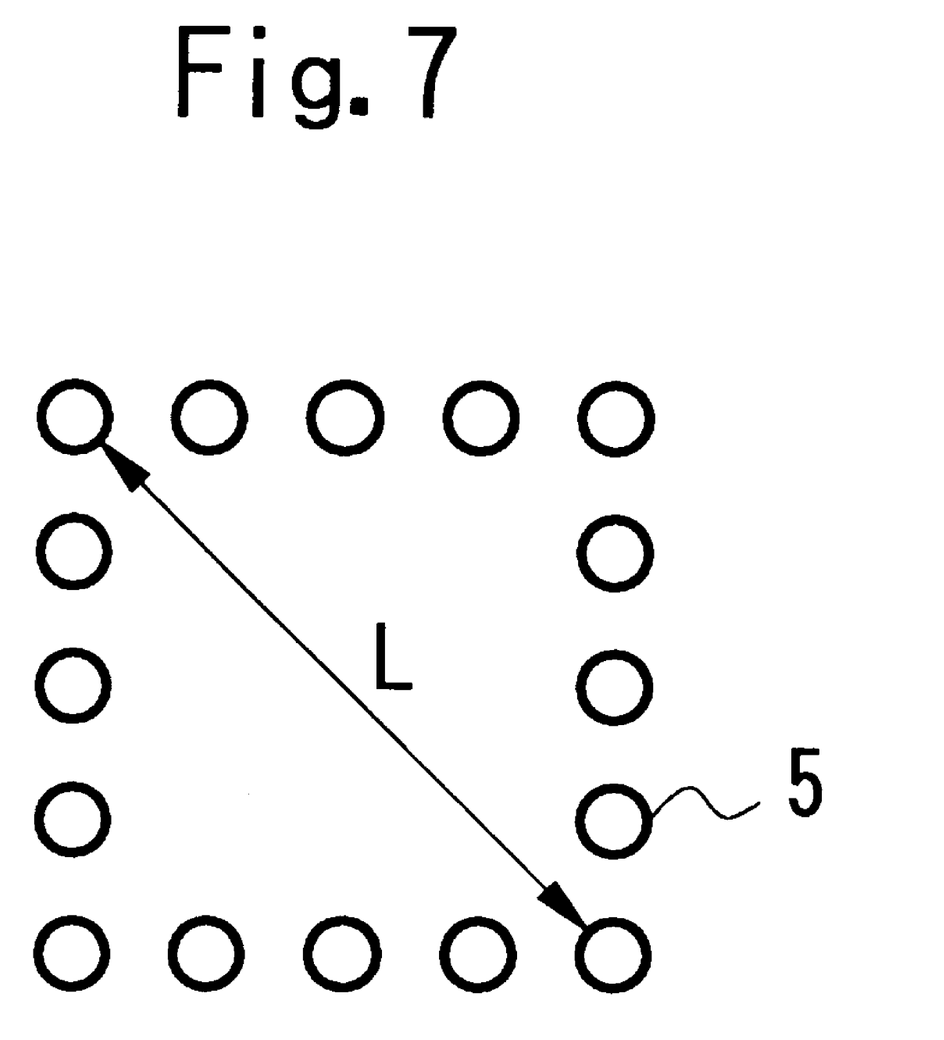
FIG. 7 shows the position of a through-hole formed in an insulating substrate to be processed.

Referring to the embodiment shown in FIG. 7, the position of the processing target through-holes 5 formed in the insulating substrate is shown. In this embodiment, the plating solution is spouted from a single jet stream opening towards all through-holes 5 which are disposed such that the center of the through-hole 5 comes on the side of the square. For example, when the maximum distance L between through-holes is not more than 20 mm, the size of the jet stream opening (e.g., diameter when the shape is circular, and when the shape is polygon such as square, the maximum length of diagonal line) is preferably 0.2 to 1 times the maximum distance L between through-holes. When it is less than 0.2 times, the amount of the jets of the plating solution becomes small, so that the air bubbles in the through-hole in which the conductive circuit (which becomes the negative electrode) is exposed cannot be released, resulting in a failure to grow a bump contact point. When it is greater than the maximum distance, the liquid pressure of the jets of the plating solution becomes low to the extent that the air bubbles in the through-hole cannot be released, again resulting in a failure to grow a bump contact point.

The jet stream opening is preferably set at a position 5 mm–40 mm below the surface of the plating solution. When the distance is less than 5 mm, the plating solution catches more air bubbles to accelerate the decomposition of brightener. When it exceeds 40 mm, the part to be plated, namely, the part to grow a bump contact point receives less liquid pressure, which again results in a failure to release the air bubbles and a failure to grow a bump contact point.

It is preferable that a plate is disposed between the negative electrode and storage tank, as shown in FIG. 1. The plate may be any as long as it has an aperture to allow spouting of the plating solution toward the negative electrode. The plate may be set using a jet stream treatment tank and the like. In FIG. 1, the plate is disposed on the jet stream treatment tank 9 and between the insulating substrate 3 and storage tank 1. As shown in FIG. 1, a rubber sheet 17 may be disposed between the plate 13 and insulating substrate 3, but it is preferable that there be no gap produced between these and the rubber sheet 17. The plate preferably has slit and groove.

Figure 2:
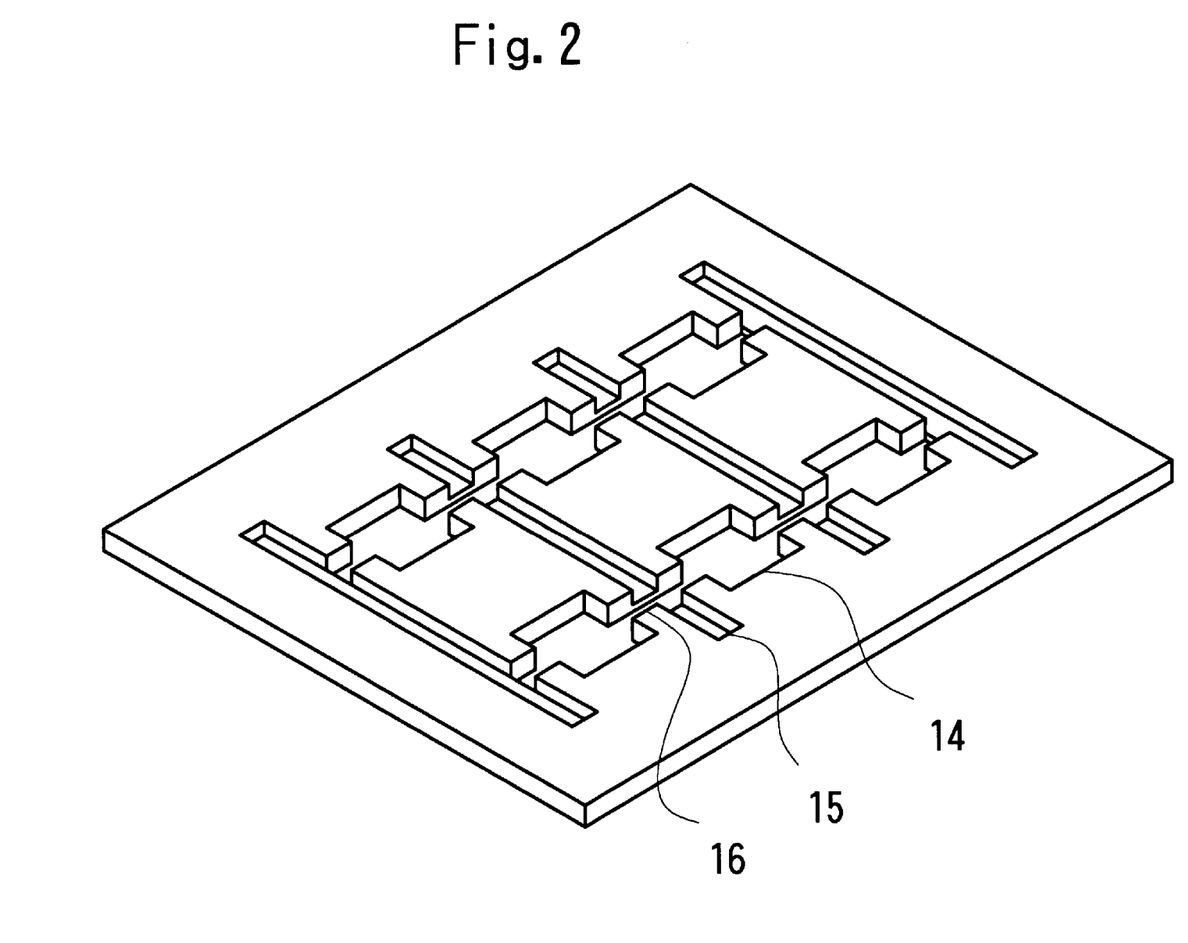
FIG. 2 is a perspective view showing the plate to be used for the inventive jet stream type plating apparatus.

FIG. 2 is a perspective view showing one embodiment of the plate including a view of a part of the plate. The plate is shown in this Figure when its surface opposite to the storage tank is facing upward. As shown in this Figure, plate 13 comprises plural apertures 14 to expose negative electrode, and slit and groove are formed in the thickness direction from the side of the plate facing the storage tank. The slit 16 penetrates the plate 13 in the thickness direction, and connects with plural apertures 14. The groove 15 passes the center of the aperture, crosses the slit 16 and connects therewith. The groove 15 is narrow and long, and uncontinuous where it crosses the slit 16. By forming slit 16 and groove 15, the spouted plating solution is delivered to the outside of the storage tank through slit 16 and groove 15.

The plate is preferably set so that a clearance can be formed between the plate and the storage tank. Under the above-mentioned plating conditions, the clearance is preferably set to be 0.2 mm–2 mm. When it is less than 0.2 mm, the amount of the spouted plating solution which flows to the outside of the storage tank through the passage between the storage tank and the plate after being spouted becomes nonuniform to cause variation in the height of bump contact points. When it exceeds 2 mm, the liquid pressure of the spouted plating solution at the negative electrode decreases to cause absence of bump contact point.

The thickness of the plate is preferably 5 mm–30 mm. When it is less than 5 mm, the aperture becomes shallow, which creates greater variation in the height of bump contact points. When the plate is pressed as shown in FIG. 1, a plate having a thickness of less than 5 mm may be distorted depending on its material. Therefore, the clearance between the plate and the storage tank cannot be maintained the same. As a result, the amount of the plating solution flowing to the outside of the storage tank becomes nonuniform and the height of the bump contact points varies. When the thickness is greater than 30 mm, the liquid pressure of the spouted plating solution decreases at the object to be plated, and air bubbles in the through-hole, in which the conductive circuit is exposed, cannot be released, thus failing to grow a bump contact point.

The aperture only need be formed so as not to hinder the flow of the plating solution. When the plating solution is spouted separately towards each negative electrode, only one aperture is formed per one negative electrode. On the other hand, when it is spouted from a single jet stream opening towards plural negative electrodes, one aperture is formed to expose these plural negative electrodes.

The size of the aperture is appropriately determined according to the number of the through-hole wherein the conductive circuit is exposed, the size of said through-hole and the length of the array of the through-holes. For example, in the embodiment shown in FIG. 7 above, when the maximum distance L between through-holes is not more than 20 mm, the size of the aperture (e.g., diameter when the shape is circular, and when the shape is polygon such as square, the maximum length of diagonal line, hereinafter the same) is preferably 1.1–2 times the maximum distance L between through-holes. When it is less than 1.1 times that, the positioning of the aperture and the corresponding plural negative electrodes becomes difficult. When it exceeds 2 times that, the height of the bump contact points comes to have greater variations.

The points of connection between aperture and slit are preferably 2 or 4. When they are two, the two slits preferably face each other at a minimum distance between them. When they are four, the connection points preferably divide the aperture evenly and the slits face each other at a minimum distance between them. For example, as shown in FIG. 2, when the aperture 14 is rectangular, the middle point of the side of aperture 14 preferably becomes the connection point. When the connection point makes the distance between slits 16 maximum, for example, when slit 16 is connected to one corner of rectangle of FIG. 2 and the corner opposing same, the liquid pressure at the four corners of the aperture 14 decreases to also unfavorably decrease the height of the bump contact point.

The slit is formed in the thickness direction of the plate, connected with the aperture and then with the groove such that it leads the spouted out plating solution to the groove. It may also convey the spouted plating solution to the outside of the storage tank. The air bubbles in the vicinity of the through-hole 5 formed in the insulating substrate are removed by the structure wherein, as shown in FIG. 2, the slit 16 penetrates the plate 13 in the thickness direction and connects with aperture 14.

The width of the slit is preferably 0.05–0.3 time the size of the aperture under the above-mentioned plating conditions. When it is less than 0.05 time the size of the aperture, the plating solution does not flow smoothly and thus, the air bubbles in the aperture cannot be removed, which in turn results in insufficient height of the bump contact point. When it exceeds 0.3 time the size of the aperture, the height of the bump contact points becomes nonuniform.

The groove crosses the slit and connects therewith, and may lead the spouted plating solution to the outside of the storage tank. The groove may connect with the aperture, though the otherwise is preferred. The width of the groove is the same as or less than the width of the slit under the above-mentioned plating conditions, with preference given to not more than 0.8 time the distance between apertures. When the width of the groove is less than the width of the slit, the bump contact point does not grow sufficiently. When it is greater than 0.8 time the distance between apertures, the plate cannot retain its strength. The depth of the groove is preferably not less than 2 mm and not more than 0.8 time the thickness of the plate. When the depth of the groove is less than 2 mm, the plating solution does not flow smoothly, which in turn results in insufficient height of the bump contact point. When it is greater than 0.8 time the thickness of the plate, the plate cannot retain its strength. The position of the groove may be any as long as it leads the plating solution to the outside of the storage tank.

The jet stream type plating apparatus of the present invention preferably includes a jet stream treatment tank and a supply tank. The jet stream treatment is done in the jet stream treatment tank. The jet stream treatment tank may be any as long as it can contain a storage tank and store the plating solution after spouting and electroplating. The jet stream treatment tank is connected to the supply tank and delivers the stored plating solution to the supply tank. The jet stream treatment tank and the supply tank are connected by a conventional tube or pipe.

The shape of the jet stream treatment tank is not particularly limited and may be determined as appropriate. Examples thereof include hollow cube, rectangular solid, column and the like, having a bottom. The volume of the jet stream treatment tank is not particularly limited and may be determined as appropriate. The material for forming the jet stream treatment tank may be any as long as it is free of leakage of the plating solution and scarcely affected by the plating solution, which may be known resin or metal.

The pressure in the jet stream treatment tank is preferably about the atmospheric pressure, preferably with no variation. The jet stream treatment tank is preferably not sealed but allows natural ventilation.

For example, when the jet stream treatment tank 9 shown in FIG. 1 is sealed, the plating solution sent to the storage tank 1 by a pump and spouted discharges the air in the jet stream treatment tank 9 when it returns to the supply tank 10. As a result, the jet stream treatment tank 9 is depressurized, which causes deformation of the insulating substrate 3 formed from a flexible material and produces wrinkles on the periphery of the aperture 14 of the plate 13. The hydrogen gas and mist are generated in the jet stream treatment tank during plating which should be discharged. When these are discharged by forced ventilation, the oxygen level in the jet stream treatment tank is hardly maintained at the same level.

The supply tank stores the plating solution sent out from the jet stream treatment tank and supplies this plating solution to the storage tank. For this end, a supply pump is equipped in the inside or outside thereof. The supply tank may be appropriately equipped with a flow meter, a filter and the like in the inside or outside thereof. The plating solution is delivered to the storage tank using a conventional tube or pipe.

The shape of the supply tank is not particularly limited and may be determined as appropriate. The shape of the supply tank is exemplified by hollow cube, rectangular solid, column and the like, having a bottom. The volume of the supply tank is not particularly limited and may be determined as appropriate. The material of the supply tank may be any as long as it is free of leakage of the plating solution and scarcely affected by the plating solution, which may be a known resin or metal.

It is preferable that a nitrogen gas be supplied to the jet stream treatment tank and supply tank. The purity of the nitrogen gas is not less than 99.9%. The supply amount of the nitrogen gas is preferably not less than 0.2 m$^3$/hr per 1 m$^3$ of the space not occupied by the plating solution in the jet stream treatment tank and supply tank. The volume of the space not occupied by the plating solution in the jet stream treatment tank and supply tank is about 0.0001 m$^3$–0.01 m$^3$ for jet stream treatment tank and about 0.01 m$^3$–1 m$^3$ for supply tank. In this case, nitrogen gas is preferably supplied so that the oxygen level in said space may be not more than 1%.

When the nitrogen gas supply is less than 0.2 m$^3$/hr, natural ventilation of the jet stream treatment tank and supply tank leads to the difficulty in maintaining the oxygen level at not more than 1%. When the oxygen level exceeds 1%, the components of the brightener contained in the plating solution are oxidatively decomposed and the component balance of the brightener is ruined. When the component balance of the brightener is lost, the shape of the bump contact point may become not a mushroom but a flat one, or the vertex thereof may be slipped due to the flow of the plating solution, thereby producing various heights of the bump contact points. Moreover, imbalanced components of the brightener eliminate the gloss on the surface of the bump contact point and give a rough surface.

The rubber sheet to be interposed between the insulating substrate and the plate may be any as long as it can inhibit liquid leakage from the jet stream treatment tank and has an aperture so that the spouting toward the negative electrode will be secured, like the above-mentioned plate. The material of the rubber sheet may be, for example, silicone rubber, fluoro rubber and the like, which may be used as appropriate. Considering the sealing property between the rubber sheet and the insulating substrate, as well as chemical resistance, fluoro rubber is preferable.

When the jet stream type plating apparatus is used for a continuous treatment, the surface of the rubber sheet 17 may be made rough using a sand paper, or a material having flexibility (e.g., sponge) is used, so that the insulating substrate can be detached smoothly from the rubber sheet (as shown in FIG. 1, hereinafter the same). Without the smooth detachment of the insulating substrate from the rubber sheet, wrinkles may be created on the insulating substrate. Further, in the case of continuous production, absent smooth detachment, the position of the negative electrode slips from the position of the corresponding aperture to often result in no formation of the bump contact point.

As used herein, the continuous treatment means that a base material in a continuous form (e.g., width 125 mm, length not less than 5 m) is continuously delivered, and subjected to a series of plating steps (e.g., soft etching, washing with water, copper plating, washing with water, drying or soft etching, washing with water, gold striking, washing with water, gold plating, washing with water and drying) to form a bump contact point.

The aperture to be formed on the rubber sheet preferably has the same shape and size with the aperture to be formed in the plate. When it is smaller than the aperture to be formed in the plate, it covers a part of the through-hole where a conductive circuit is exposed, thereby preventing complete growth of the bump contact point. When it is large, air bubbles tend to stay in the clearance between the plate and the insulating substrate, again preventing growth of the bump contact point. The rubber sheet may be provided with a slit like that formed in the plate. When a slit is not formed on the rubber sheet, the thickness of the rubber sheet is preferably not more than 3 mm. When the thickness of the rubber sheet exceeds 3 mm, the bubbles near the through-hole are hardly removed, thus preventing the complete growth of the bump contact point.

The rubber sheet to be disposed under the press board (rubber sheet 18 in FIG. 1, hereinafter the same) has an outside dimension which is greater by not less than 4 mm at the edge than the edge of the aperture formed in the plate or that of the slit. When the difference is less than 4 mm, liquid leakage tends to occur when the plating solution is spouted. The outside dimension of the rubber sheet may be extended unless it covers a through-hole, such as a sprocket, formed on the insulating substrate for transport of the same in a continuous treatment. When the rubber sheet covers such hole, the liquid may leak from the hole.

The present invention is described in more detail by referring to Examples.

Using a jet stream type plating apparatus shown in FIG. 1, a circuit substrate having a bump contact point was provided.

EXAMPLE 1

A polyimide precursor solution was applied on a 35 μm thick copper foil so that the thickness after drying was 25 μm. This was dried and cured to give a two layer film of the copper foil and the polyimide film which was the insulating substrate. Then, a resist layer was formed on the surface of the copper foil to form a circuit pattern, and a conductive circuit having a desired circuit pattern was formed by a photo processing.

A KeF exima laser beam having an oscillation wavelength of 248 nm was irradiated through a mask onto a part of the polyimide film at which a bump contact point was to be formed, which film being on the opposite side of the above-mentioned conductive circuit, whereby 208 through-holes were formed by dry etching. Each through-hole had a conductive circuit exposed on the bottom of the inside thereof, which was used as a negative electrode. The through-hole was formed such that the center of the through-hole came on the side of the square (one side 7 mm). Taking 208 through-holes thus formed as one set, thirty sets of the through-holes were formed on an insulating substrate (5 sets lengthwise and 6 sets crosswise). The diameter of the inside bottom of each through-hole was 50 μm and diameter of the top surface of the through-hole was 60 μm.

Then, oxygen plasma was applied to the through-hole, and the copper foil exposed in the through-hole was treated with a soft etching solution of sodium persulfate, washed with pure water (not more than 2 μS/cm) and subjected to copper sulfate plating under the following plating conditions and using the following plating apparatus.

[Plating Conditions]

The plating solution contained, in 1 l of the plating solution, copper sulfate; 70 g, sulfuric acid; 190 g, additive (THRU-CUP AC90, manufactured by C. UYEMURA & CO., LTD.; 20 mL and chlorine to a concentration of 60 ppm. The operation conditions of jet stream type electroplating were as follows: flow amount per one jet stream opening; 100 L/hr, temperature of plating solution; 25° C., current density; 15 A/dm$^2$, and plating time; 10 minutes. One set received one jet stream for plating.

[Plating Apparatus]

The conditions of the jet stream type plating apparatus were: amount of plating solution; 200 L, size (depth×width×height) of the inside of jet stream treatment tank; 0.1 m×0.5 m×0.5 m, volume of the space not occupied by the plating solution inside the jet stream treatment tank; 0.015 m$^3$, size (depth×width×height) of the inside of supply tank; 0.5 m×0.5 m×1.0 m, volume of the space not occupied by the plating solution inside the supply tank; 0.07 m$^3$.

The plate was formed to have the shape shown in FIG. 2, wherein the thickness of the plate was 15 mm, aperture was a square having 14 mm each side, the width of the slit was 2 mm, the width of the groove was 4 mm and the depth of the groove was 10 mm. Thirty apertures were formed so that one aperture corresponds to one set of through-holes. The slit was formed such that it passed the center of the distance between two sides of two opposing apertures. The groove passed the center of the distance between two adjacent apertures and crossed the slit in a vertical relationship.

The rubber sheet disposed between the plate and insulating substrate was a 1 mm thick fluoro rubber sheet, and the rubber sheet to be disposed below the press board was a 5 mm thick sponge-like fluoro rubber sheet.

The jet stream opening had a diameter of φ4 mm and thirty openings were formed for plating wherein one set received one jet stream. In this case, the center of the square formed by connecting the centers of the through-holes within one set corresponded to the center of the jet stream opening. The jet stream opening was set to make the distance between the surface of the plating solution stored in the storage tank and the opening 20 mm.

The storage tank had a rectangular outside shape and the size of the inside was 110 mm×88 mm×150 mm. The storage tank was set to make the clearance between the tank and the plate 1 mm. Two supply inlets were formed to supply the plating solution into the storage tank, which were placed at the positions on the sides of the storage tank which were opposite to each other.

[Evaluation of the Circuit Substrate Having Bump Contact Point]

The bump contact point formed had gloss on the surface and the shape thereof was like a mushroom. The vertex of the bump contact point was located in the center of the diameter of the bump contact point. No abnormality was found and the amount of slip of the vertex was not more than 5%. The amount of slip was calculated by the following formula.

$$\text{Amount of slip} = (R - \text{radius of bump contact point}) / \text{diameter of bump contact point} \times 100$$

wherein R is the maximum distance from the outer periphery of bump contact point to the vertex of the bump contact point.

The height of the bump contact point was measured from the surface of the insulating substrate. The determination was performed with respect to optionally selected one bump contact point from each set and 30 bump contact points in total. As a result, the average height of the bump contact point from the polyimide surface was 15 μm, minimum height was 13 μm and maximum height was 17 μm. The coefficient of variation which shows variation in the height of the bump contact point was 3%. The coefficient of variation was calculated by the following formula.

$$\text{Coefficient of variation} = \text{standard deviation} / \text{average value} \times 100$$

Figure 8:
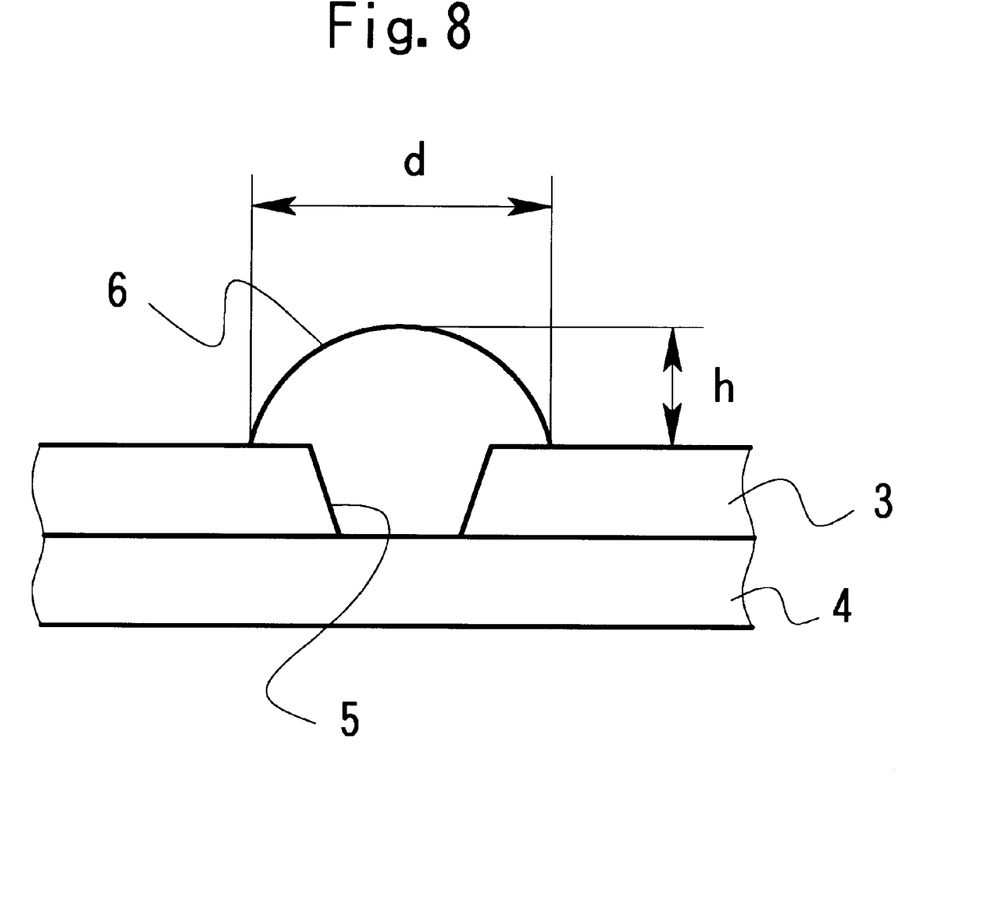
FIG. 8 is a cross sectional view showing a bump contact point formed on an insulating substrate by the production method of the present invention.

Then, the circuit substrate having a bump contact point was continuously produced under the above-mentioned conditions. As a result, the shape of the bump contact point was of a normal mushroom type for consecutive 600 hours. The normal mushroom shape of the bump contact point in this Example has a ratio of the height h to diameter d (h/d) of the bump contact point 6 shown in FIG. 8, of 0.15–0.3. FIG. 8 shows a cross sectional view of the bump contact point formed on an insulating substrate.

EXAMPLE 2

In the same manner as Example 1, electroplating was applied until the bump contact points had an average height of 5 μm. The amount of slip was not more than 5%. Then, gold plating was applied to precipitate gold having a hardness of 70 Hv in the thickness of 10 μm on the surface of said bump contact point, whereby a bump contact point having two layer plating of copper and gold was prepared. The conditions of gold plating were the same as those in Example 1 except the following: gold plating solution; S-440, N.E. CHEMCAT CORPORATION, temperature of plating solution; 70° C., current density; 3.5 A/dm$^2$, plating time; 6 minutes, flow amount per one jet stream opening; 1.5 L/min, number of jet stream opening; 30, diameter of jet stream opening; φ4 mm, distance between jet stream opening and surface of plating solution; 0 mm, and positive electrode; platinum mesh. The bump contact point thus prepared was connected to an aluminum electrode, but no connection failure was found.

Comparative Example 1

In the same manner as in Example 1 except that jet stream opening was set at a position where the distance to the surface of the plating solution was 0 mm, a circuit substrate having a bump contact point was prepared. As a result, the average height of the bump contact point was 15 μm in the first plating, and the shape of the bump contact point was of a normal mushroom type.

After the first plating, electroplating was stopped for one hour, during which period jetting was continued. Then, electroplating was performed again, whereby another circuit substrate having a bump contact point was produced. The average height of the bump contact point was 10 μm, minimum height was 5 μm and maximum height was 15 μm. The coefficient of variation was 7%. The shape of the bump contact point was flat, and the vertex of the bump contact point slipped toward the flow direction of the plating solution. The amount of slip was 10–20%, which was more than twice the slip amount of the normal mushroom shaped bump contact point.

Comparative Example 2

In the same manner as in Comparative Example 1, electroplating was applied until the bump contact points had an average height of 5 μm. The amount of slip was 15%. Then, gold plating was applied to precipitate gold having a hardness of 70 Hv in the thickness of 10 μm on the surface of said bump contact point, whereby a bump contact point having two layer plating of copper and gold was prepared. The conditions of gold plating were the same as those in Example 2. The bump contact point thus formed was connected to an aluminum electrode, but connection failure occurred.

According to the present invention, a jet stream type electro-plating using a plating solution containing a brightener successfully inhibited mixing of air bubbles in the plating solution, which in turn enabled suppression of oxidative decomposition of the brightener components.

As a consequence, the bump contact point can have a mushroom shape, and variations in the height of the bump contact points can be minimized. In addition, slip of the vertex of the bump contact point and loss of bump contact points can be avoided.

What is claimed is:

1. A jet stream method for producing a circuit substrate having a bump contact point, comprising the steps of:
    (a) disposing a positive electrode in a plating solution,
    (b) exposing a conductive circuit formed on an insulating substrate, wherein the insulating substrate is provided above the surface of the plating solution,
    (c) disposing a jet stream opening below the surface of the plating solution and opposite the conductive circuit, and
    (d) spouting out the plating solution from the jet stream opening toward the conductive circuit opposite the jet stream opening for electroplating, to form the bump contact point on the surface of the conductive circuit.

2. The method of claim 1, wherein the conductive circuit is exposed in a through-hole formed at a position of the insulating substrate at which the bump contact point is to be formed.

3. The method of claim 1, wherein the plating solution is a copper sulfate plating solution, and the distance between the surface of the copper sulfate plating solution stored in the storage tank and the jet stream opening is 5 mm–40 mm.

4. The method of claim 3, wherein the plating solution is spouted out from one jet stream opening in a flow amount of 30 L/hr–200 L/hr, and the plating solution is set to a temperature of 20° C.–30° C. and applied with a current having a density of 10 A/dm$^2$–20 A/dm$^2$.

5. The method of claim 1, wherein the storage tank has a box shaped block in the center thereof and the positive electrode is formed in the block.

6. The method of claim 1, wherein the jet stream opening is formed by providing a through-hole in a plate.

* * * * *